(12) United States Patent
Hasuo et al.

(10) Patent No.: US 8,736,457 B2
(45) Date of Patent: May 27, 2014

(54) INFORMATION PROCESSING APPARATUS AND METHOD, SERVER APPARATUS, SERVER APPARATUS CONTROL METHOD, AND PROGRAM

(75) Inventors: Takashi Hasuo, Tokyo (JP); Kohtaro Sabe, Tokyo (JP); Masato Ito, Tokyo (JP); Yoshiyuki Kobayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 13/487,166

(22) Filed: Jun. 2, 2012

(65) Prior Publication Data

US 2012/0313789 A1 Dec. 13, 2012

(30) Foreign Application Priority Data

Jun. 10, 2011 (JP) ................ 2011-130006

(51) Int. Cl.
- G08B 21/00 (2006.01)
- G01R 21/00 (2006.01)
- H02J 13/00 (2006.01)
- G01R 15/14 (2006.01)

(52) U.S. Cl.
CPC ............... H02J 13/001 (2013.01); G01R 15/14 (2013.01)
USPC ........................................ 340/664; 702/60

(58) Field of Classification Search
CPC .............. H02J 13/001; G01R 15/14
USPC ............. 340/664; 700/298; 713/300; 702/60
See application file for complete search history.

(56) References Cited

U.S. PATENT DOCUMENTS

| 7,458,028 B2* | 11/2008 | Chidambaram et al. ....... 715/736 |
| 7,483,797 B2* | 1/2009 | Nambu ........................... 702/60 |
| 8,364,961 B2* | 1/2013 | Tanaka et al. ................. 713/168 |
| 2011/0185197 A1* | 7/2011 | Ukita et al. .................... 713/300 |
| 2012/0296491 A1* | 11/2012 | Schmid ......................... 700/298 |

FOREIGN PATENT DOCUMENTS

JP 2008-039492 2/2008

OTHER PUBLICATIONS

Shinkichi Inagaki et al.; Nonintrusive Appliance Load Monitoring System "Discrete Operating Conditions and Integer Programming;" 42-th Dispersion Event System Research Meeting in Measurement Automation Control Society; pp. 33-38; Dec. 20, 2008; Oosaka University.

* cited by examiner

Primary Examiner — John A Tweel, Jr.
(74) Attorney, Agent, or Firm — Dentons US LLP (57) ABSTRACT

There is provided an information processing apparatus including a current waveform acquisition unit which acquires a current waveform from when a predetermined electric appliance is used, a communication unit which transmits the acquired current waveform of the electric appliance to a server apparatus, and receives control information on a character corresponding to the electric appliance from the server apparatus, and a display control unit which performs control of causing a predetermined display unit to display the character based on the received control information on the character.

15 Claims, 9 Drawing Sheets

INFORMATION PROCESSING APPARATUS AND METHOD, SERVER APPARATUS, SERVER APPARATUS CONTROL METHOD, AND PROGRAM

BACKGROUND

The present technology relates to an information processing apparatus and method, a server apparatus, a server apparatus control method and a program, and in particular, to an information processing apparatus and method that enable reduction in the load of a current waveform registration operation, a server apparatus, a server apparatus control method and a program.

Figure 1:
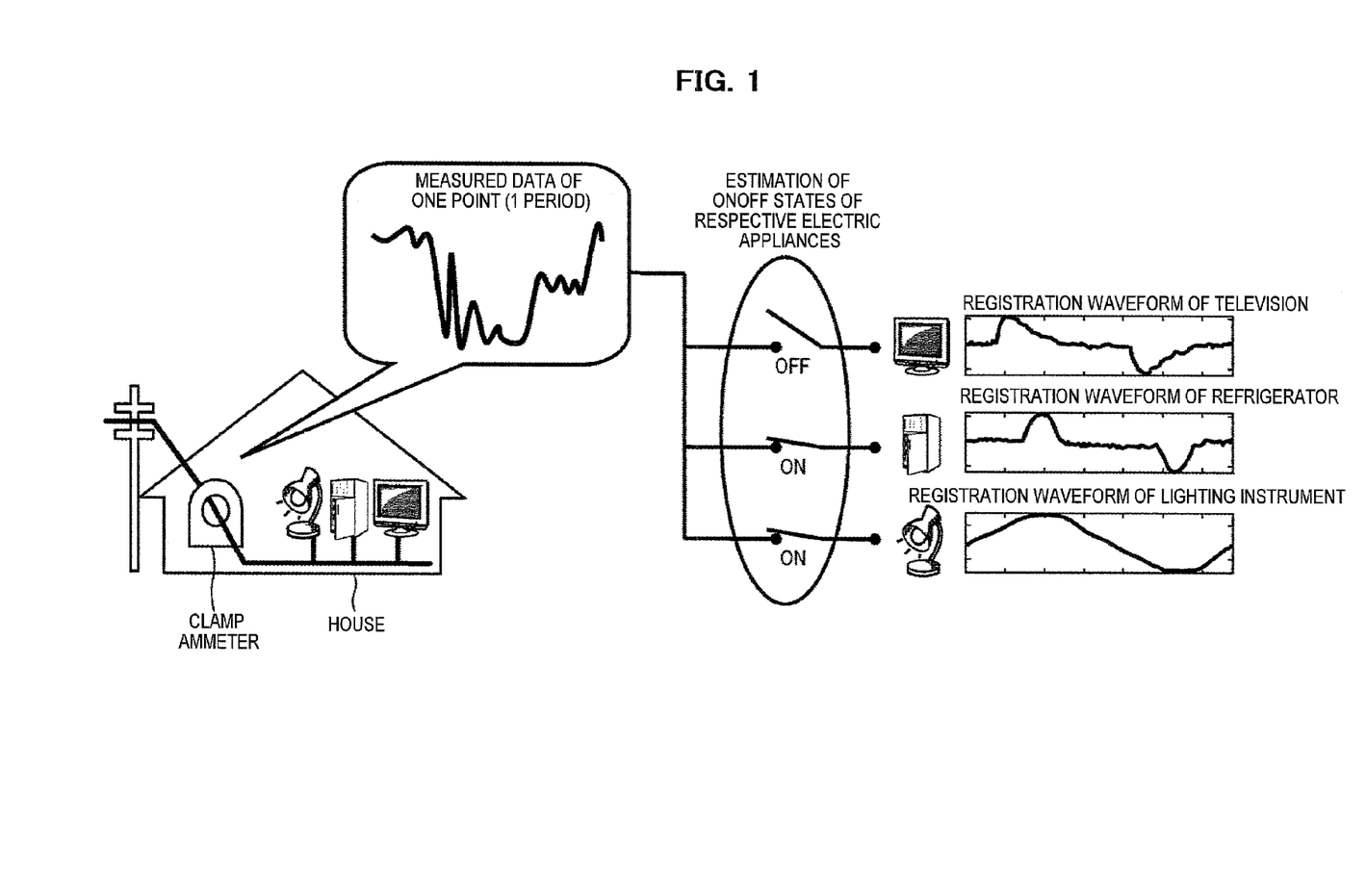
FIG. 1 is a diagram illustrating a summary of a monitoring system.

As shown in FIG. 1, there is a system that measures a current waveform of one point of a switchboard, which is a basis of power supply, by a clamp ammeter or the like and thereby monitors usage states (ON/OFF states) of a plurality of electric appliances connected to a lower flow side than the one point, for example, in each house (for example, see Japanese Patent Publication No. 2008-039492, and Non-patent Document, "Nonintrusive Appliance Load Monitoring System—Discrete Operating Conditions and Integer Programming—," 42nd Society of Instrument and Control Engineers (SICE) Discrete Event System Research Group, pp. 33-38, Dec. 20, 2008, Osaka University).

As a method of estimating usage states of a plurality of electric appliances connected to a lower flow side from a current waveform measured at a source, a separative estimation technique of separating a mixed current waveform, in which current waveforms of the plurality of electric appliances are mixed, into the current waveforms of the respective electric appliances and estimating the current waveforms is used. For separation and estimation of the mixed current waveform, it is preferable that the current waveforms of the respective electric appliances be registered in advance.

SUMMARY

However, an operation of registering the current waveform of an electric appliance is a troublesome operation for a user and becomes a heavy burden.

The present technology has been achieved in consideration of such a situation, and enables reduction in the load of a current waveform registration operation.

An information processing apparatus according to a first aspect of the present technology includes: a current waveform acquisition unit which acquires a current waveform from when a predetermined electric appliance is used; a communication unit which transmits the acquired current waveform of the electric appliance to a server apparatus and receives control information on a character corresponding to the electric appliance from the server apparatus; and a display control unit which performs control of causing a predetermined display unit to display the character based on the received control information on the character.

An information processing method according to the first aspect of the present technology includes: acquiring a current waveform from when a predetermined electric appliance is used; transmitting the acquired current waveform of the electric appliance to a server apparatus and receiving control information on a character corresponding to the electric appliance from the server apparatus; and performing control of causing a predetermined display unit to display the character based on the received control information on the character.

A program according to the first aspect of the present technology is intended to cause a computer to perform processes of: acquiring a current waveform from when a predetermined electric appliance is used; transmitting the acquired current waveform of the electric appliance to a server apparatus and receiving control information on a character corresponding to the electric appliance from the server apparatus; and performing control of causing a predetermined display unit to display the character based on the received control information on the character.

In the first aspect of the present technology, a current waveform from when a predetermined electric appliance is used is acquired, the acquired current waveform of the electric appliance is transmitted to a server apparatus, control information on a character corresponding to the electric appliance is received from the server apparatus, and a predetermined display unit is controlled to display the character based on the received control information on the character.

A server apparatus according to a second aspect of the present technology includes: a communication unit which receives a current waveform from when a predetermined electric appliance is used from a predetermined information processing apparatus and transmits control information on a character corresponding to the electric appliance to the information processing apparatus; a current waveform feature analysis unit which analyzes a feature of the received current waveform of the electric appliance; and a character information generation unit which generates the control information on the character transmitted to the information processing apparatus based on the feature of the current waveform of the electric appliance, which is the analysis result.

A server apparatus control method according to the second aspect of the present technology includes: receiving a current waveform from when a predetermined electric appliance is used from a predetermined information processing apparatus; analyzing a feature of the received current waveform of the electric appliance; generating control information on a character corresponding to the electric appliance based on the feature of the current waveform of the electric appliance, which is the analysis result; and transmitting the generated control information on the character to the information processing apparatus.

A program according to the second aspect of the present technology is intended to cause a computer to perform processes of: receiving a current waveform from when a predetermined electric appliance is used from a predetermined information processing apparatus; analyzing a feature of the received current waveform of the electric appliance; generating control information on a character corresponding to the electric appliance based on the feature of the current waveform of the electric appliance, which is the analysis result; and transmitting the generated control information on the character to the information processing apparatus.

In the second aspect of the present technology, a current waveform from when a predetermined electric appliance is used is received from a predetermined information processing apparatus, a feature of the received current waveform of the electric appliance is analyzed, control information on a character corresponding to the electric appliance is generated based on the feature of the current waveform of the electric appliance, which is the analysis result, and the generated control information on the character is transmitted to the information processing apparatus.

The program is transmitted through a transmission medium or recorded in a recording medium, and thereby can be provided.

The information processing apparatus and the server apparatus may be independent apparatuses, or internal blocks constituting one apparatus.

According to the first and second aspects of the present technology, it is possible to reduce the load of a current waveform registration operation.

DETAILED DESCRIPTION OF THE EMBODIMENT(S)

[Configuration Example of Monitoring System]

Figure 2:
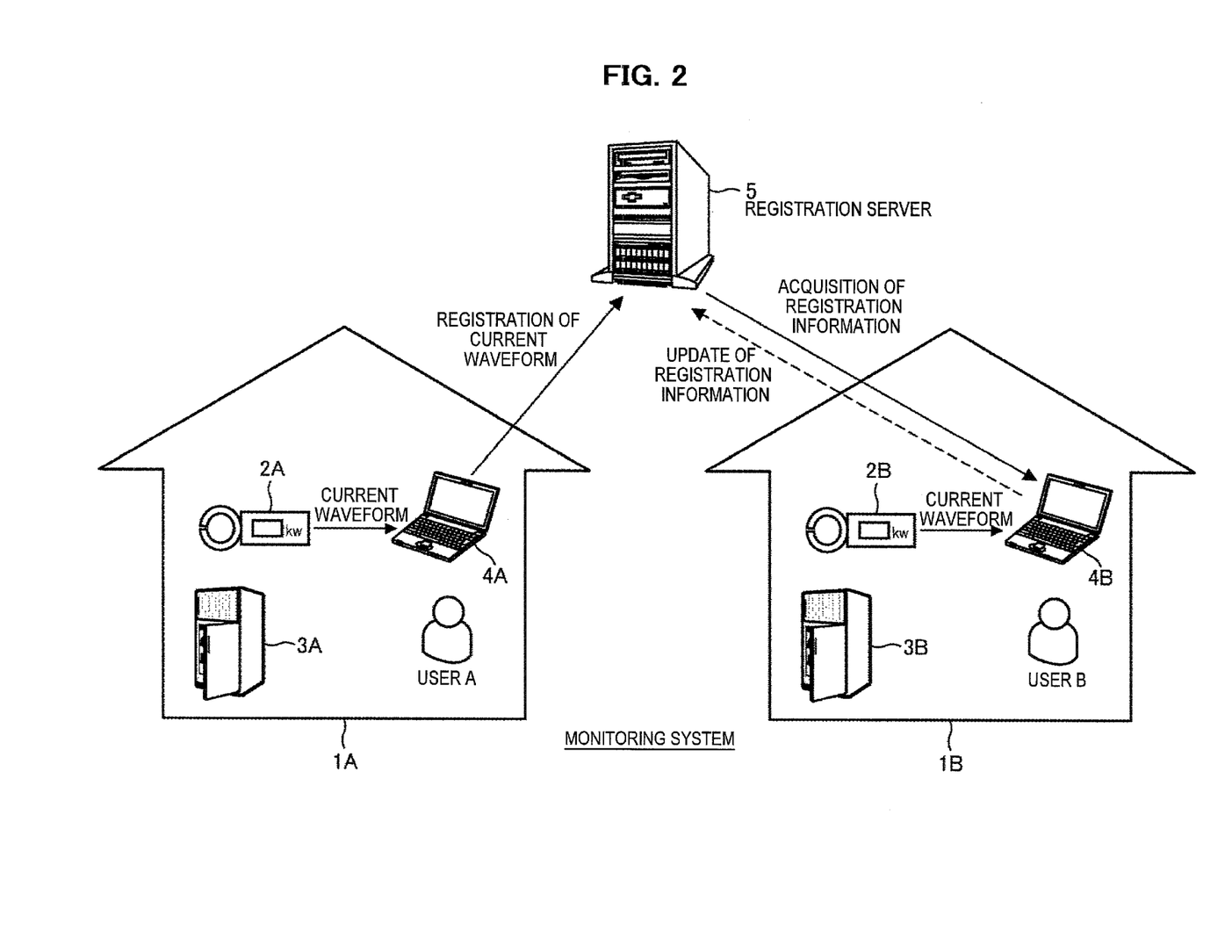
FIG. 2 is a diagram showing a configuration example of an embodiment of a monitoring system to which the present technology is applied.

FIG. 2 is a diagram showing a configuration example of an embodiment of a monitoring system to which the present technology is applied.

FIG. 2 is a system that measures a current waveform of one point of a switchboard, which is a source of power supply of each house 1, by a clamp ammeter 2 and thereby monitors usage states (ON/OFF states) of a plurality of electric appliances 3 connected to a lower flow side than the one point 2.

In each house 1, the clamp ammeter 2 that measures a current waveform, and an information processing apparatus 4 that acquires the current waveform measured by the clamp ammeter 2 and performs predetermined information processing are installed. The information processing apparatus 4 is connected with a registration server 5 in which current waveforms of various types of the electric appliances 3 used in the house 1 are registered (stored) via a network such as the Internet.

The information processing apparatus 4 installed in each house 1 has two operation modes, that is, a monitoring mode of monitoring usage states of the plurality of electric appliances 3 in the house 1 and a registration mode of registering current waveforms of the respective electric appliances 3, which are monitoring targets.

In the registration mode, the clamp ammeter 2 is clamped around a power cable of a group of the electric appliances 3 to be registered, and the information processing apparatus 4 acquires and uploads current waveforms from when the electric appliances 3, which are registration targets, are used to the registration server 5. The registration server 5 stores one current waveform as a registration waveform for electric appliances 3 of the same type, such as the same model number and the same product name, thereby storing the current waveform of a user who has uploaded the current waveform for the first time for the electric appliances 3 of the same type.

Meanwhile, in the monitoring mode, the clamp ammeter 2 is clamped around one point of a second side of the switchboard, which is the basis of power supply of each house 1, and a mixed current waveform, in which the current waveforms of the plurality of electric appliances 3 in the house 1 acquired by the clamp ammeter 2 are mixed, is supplied to the information processing apparatus 4. Also, in the monitoring mode, the information processing apparatus 4 acquires the registration waveforms of the respective electric appliances 3 from the registration server 5. On the basis of the mixed current waveform, the information processing apparatus 4 monitors (estimates) usage states of the plurality of electric appliances 3 in the house 1.

In FIG. 2, two of the houses 1 are shown and indicated by symbols 1A and 1B, respectively. Also, symbols (A, B) corresponding to the houses 1A and 1B are attached to the clamp ammeters 2, the electric appliances 3 and the information processing apparatus 4 in the houses 1. Description will be made below on the assumption that a user A in the house 1A is a user of an information processing apparatus 4A in the registration mode, and a user B in the house 1B is a user of an information processing apparatus 4B in the monitoring mode. In other words, the user A of the house 1A uploads current waveforms of a group of predetermined electric appliances 3A in the house 1A measured by the clamp ammeter 2A from the information processing apparatus 4A to the registration server 5. Also, the user B in the house 1B acquires the current waveforms of the respective electric appliances 3A registered in the registration server 5 and performs monitoring of the electric appliances 3B (the same type as the electric appliances 3A).

In the monitoring system of FIG. 2, a configuration in which an entertaining feature is given to an operation of registering current waveforms of respective electric appliances 3 used in each house 1 and thus a user of each house 1 voluntarily performs the registration operation is employed.

More specifically, when registration of a current waveform of a predetermined electric appliance 3 is performed for the first time, the registration server 5 generates a character corresponding to the registered electric appliance 3. Also, the registration server 5 registers a user who has performed the registration operation of the current waveform of the electric appliance 3 for the first time as an owner (generator) of the generated character. From now on, the user who has performed the registration operation of the current waveform of the electric appliance 3 for the first time will be referred to as an initial registrant.

For example, in the monitoring system of FIG. 2, the user A of the house 1A is determined as an initial registrant of the current waveform of the electric appliance 3A as the predetermined electric appliance 3. The user A measures a current waveform corresponding to one period (1/50 sec or 1/60 sec) of the group of the electric appliances 3A by the clamp ammeter 2A. The current waveform of the electric appliance 3A measured by the clamp ammeter 2A is supplied to the information processing apparatus 4A, and transmitted from the information processing apparatus 4A to the registration server 5 via a predetermined network such as the Internet.

The registration server 5 determines that the current waveform of (the type of) the electric appliances 3A transmitted from the information processing apparatus 4A of the house 1A has not been registered yet, that is, the user A is an initial registrant of the electric appliances 3A. The registration server 5 generates a character corresponding to the electric appliances 3A of which the current waveform is registered and registers the user A, who is the initial registrant, as an owner of the character.

After the current waveform of the electric appliances 3A is registered, another user, for example, the user B, is not able to register a current waveform of the same type of electric appliances 3B. The information processing apparatus 4B of the user B estimates ONOFF states of the electric appliances 3B in the house 1B from a mixed current waveform using the current waveform of the electric appliances 3A registered by the user A, who is the initial registrant. To this end, the information processing apparatus 4B acquires the registration waveform of the electric appliances 3A of the same type as the electric appliances 3B from the registration server 5. At this time, the information processing apparatus 4B acquires not only the registration waveform of the electric appliances 3A but also information (a user name, etc.) on the user A, who is the initial registrant, information on the character generated to correspond to the electric appliances 3A and the like as registration information. On a display of the information processing apparatus 4B in the monitoring mode, the character generated to correspond to the electric appliances 3A or the information on the user A, who is the initial registrant of the electric appliances 3, as the owner of the character is displayed in addition to the ONOFF states of the electric appliances 3B as the estimation results.

As described above, an initial registrant of a current waveform of the electric appliances 3 can be the only owner (generator) of a character corresponding to the electric appliances 3, and all users of the monitoring system are notified of information on (an image of) the generated character or the owner. To gain a reputation as an initial registrant, users voluntarily perform the operation of registering the current waveform of the electric appliances 3. In other words, the load of the current waveform registration operation is reduced.

Meanwhile, in the monitoring system of FIG. 2, the user B who is not the initial registrant can update the information on the user A as the initial registrant with information on himself/herself (the user B), for example, when usage states and the like of the electric appliances 3B satisfy a predetermined condition in the house 1B. In other words, when the usage states and the like of the electric appliances 3B satisfy the predetermined condition, the user B can take a right of the only owner of the character corresponding to the electric appliances 3 from the user A. Such an update of information on an initial registrant can be an incentive for a power-saving action of the user B for the electric appliances 3 in the house 1B or the operation of registering current waveforms of other electric appliances 3.

[Flow of Registration Process]

Figure 3:
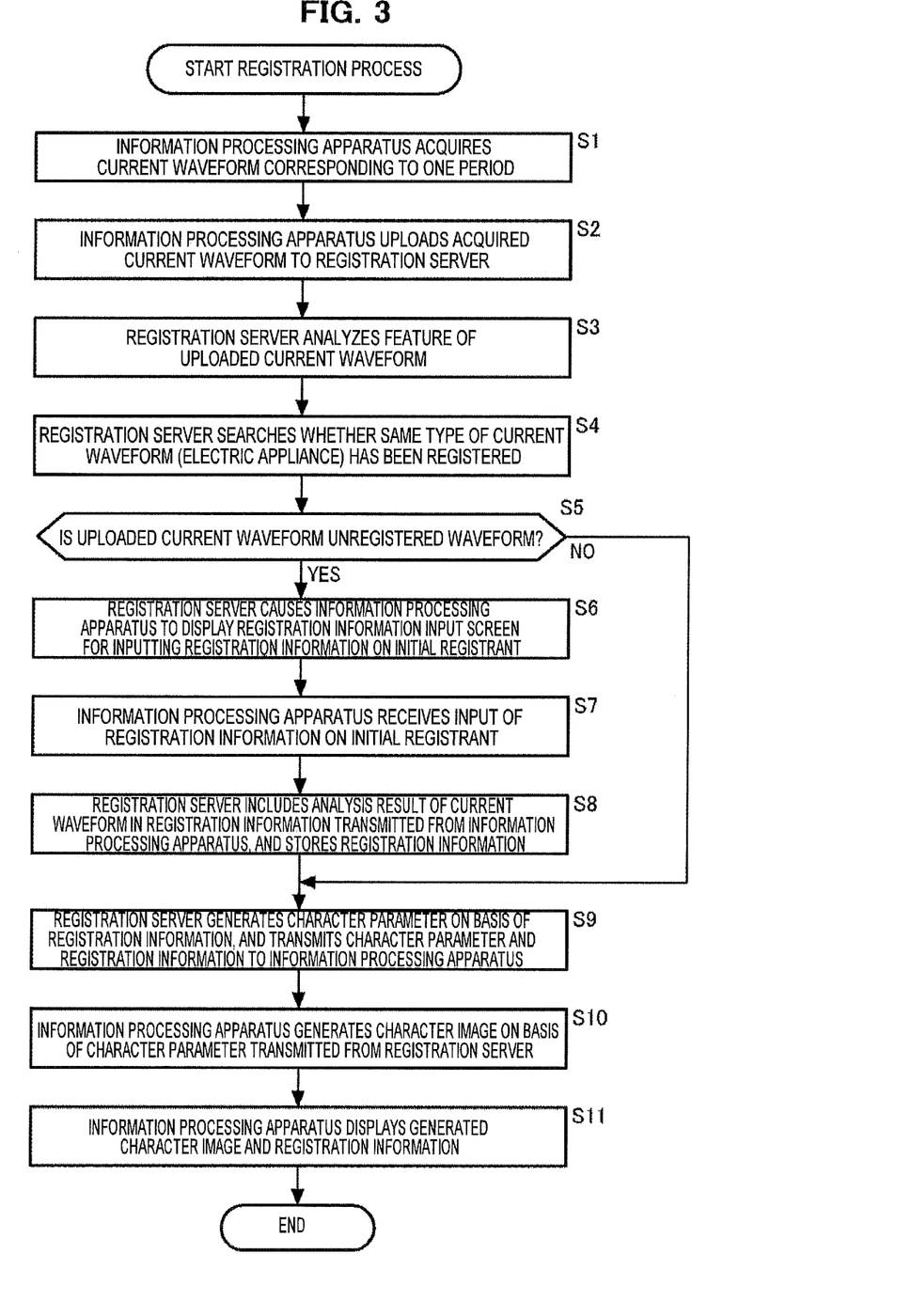
FIG. 3 is a flowchart illustrating a registration process.

With reference to the flowchart of FIG. 3, a registration process of registering a current waveform of the group of the electric appliances 3A by the information processing apparatus 4A will be described. When the registration process is performed, as described above, the clamp ammeter 2A is clamped around a power cable of the group of the electric appliances 3A to be registered, and the information processing apparatus 4A is set in the registration mode.

In step S1, the information processing apparatus 4A acquires a current waveform that is measured by the clamp ammeter 2A and corresponds to one period of the group of the electric appliances 3A. Here, the current waveform corresponding to one period may be obtained using an average value of a current waveform corresponding to a plurality of periods.

In step S2, the information processing apparatus 4A uploads (transmits) the acquired current waveform of the electric appliances 3A corresponding to one period to the registration server 5.

Figure 4:
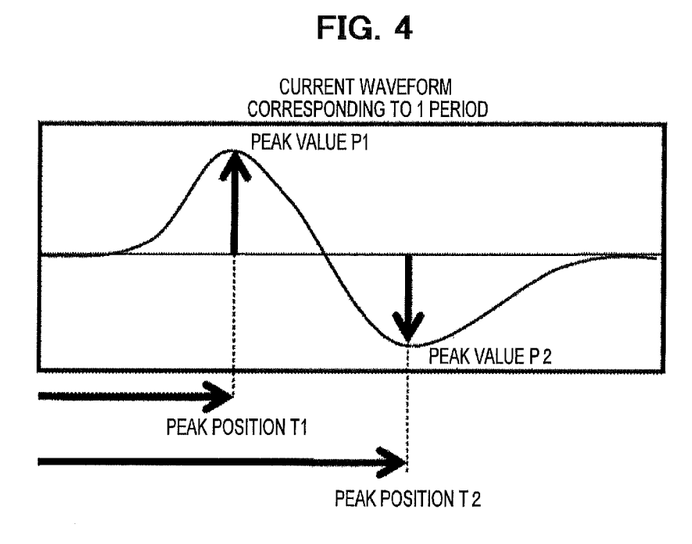
FIG. 4 is a diagram illustrating feature quantities of a current waveform.

In step S3, the registration server 5 receives the current waveform uploaded from the information processing apparatus 4A, and analyzes a feature of the received current waveform. For example, as shown in FIG. 4, the registration server 5 obtains a peak value P1 and a peak position T1 of the positive side and a peak value P2 and a peak position T2 of the negative side as feature quantities of the current waveform. In addition, values other than those mentioned above can be appropriately used as feature quantities obtained as features of the current waveform, and, for example, a Fourier coefficient used to perform a Fourier transform of the current waveform may be determined as a feature quantity of the current waveform.

In step S4, the registration server 5 searches whether a current waveform of the same type as the current waveform uploaded from the information processing apparatus 4A has already been registered. In other words, the registration server 5 searches whether an electric appliance 3 corresponding to the current waveform uploaded from the information processing apparatus 4A has been registered. For example, according to whether or not the sum of squares of current value differences between sample points corresponding to each other among current values of respective sample points constituting the current waveform is equal to or less than a predetermined threshold value, the registration server 5 searches whether a current waveform of the same type as the uploaded current waveform has already been registered.

In step S5, the registration server 5 determines whether the uploaded current waveform is an unregistered waveform on the basis of the search result.

When it is determined in step S5 that the uploaded current waveform is an unregistered waveform, the process proceeds to step S6, and the registration server 5 causes the information processing apparatus 4A to display a registration information input screen for inputting registration information on the user A as an initial registrant.

In step S7, the information processing apparatus 4A displays the registration information input screen on a display, receives an input of registration information made by the user A, and transmits the input registration information to the registration server 5. In the registration information input screen, for example, a name (nickname) of the user A, a name given to a character generated to correspond to the electric appliances 3 (3A), a product name and a model number of the electric appliances 3, an image obtained by photographing the electric appliances 3 and the like are input by the user A.

In step S8, the registration server 5 receives the registration information transmitted from the information processing apparatus 4A, includes the current waveform analysis result of step S3 in the received registration information, and stores the registration information in an internal storage unit. The registration information on the electric appliances 3 stored in the storage unit of the registration server 5 is the information input in the registration information input screen and information on the current waveform analysis result of step S3.

Meanwhile, when it is determined in step S5 that the uploaded current waveform is a registered waveform, the process of steps S6 to S8 described above is skipped.

Figure 5:
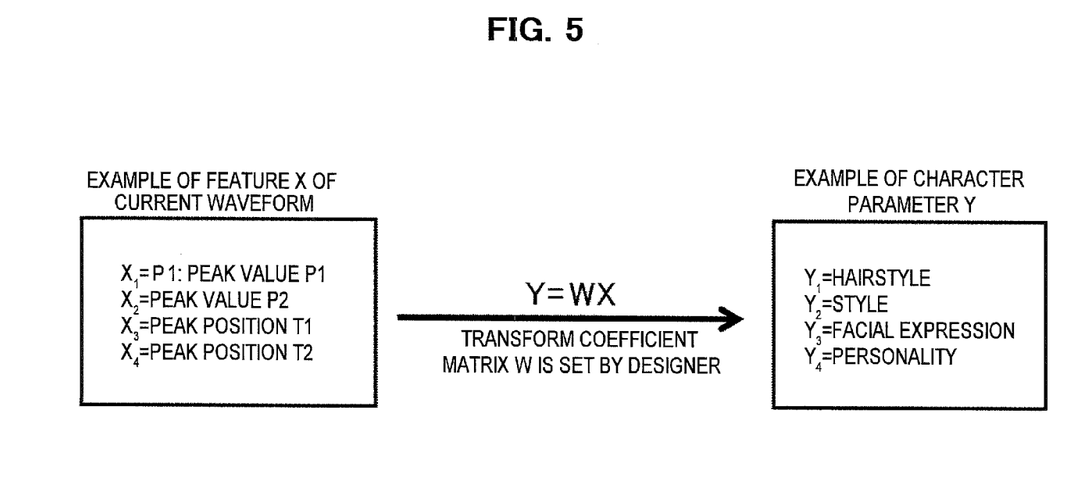
FIG. 5 is a diagram illustrating a relationship between feature quantities of current waveforms and character parameters.

In step S9, the registration server 5 generates a character parameter, which determines a feature of the character, on the basis of registration information on the electric appliances 3A, and transmits the generated character parameter and the registration information to the information processing apparatus 4A. For example, as shown in FIG. 5, the registration server 5 multiplies feature quantities $X_1$ to $X_4$ obtained as a feature X of the current waveform of the electric appliances 3A by a transform coefficient matrix W, thereby obtaining a character parameter Y consisting of four parameters $Y_1$ to $Y_4$. Here, for example, the parameter $Y_1$ is a parameter which determines a hairstyle of the character, the parameter $Y_2$ is a parameter which determines a style (clothes) of the character, the parameter $Y_3$ is a parameter which determines a facial expression of the character, and the parameter $Y_4$ is a parameter which determines a personality of the character. The transform coefficient matrix W is determined in advance and stored in the registration server 5.

In step S10, the information processing apparatus 4A generates a character image on the basis of the character parameter transmitted from the registration server 5, and in step S11, displays the generated character image and the received registration information on the display. Here, the displayed registration information is the name of the user A, who is the initial registrant, the product names of the electric appliances 3A (3B), photographic images of the electric appliances 3A and the like, and the current waveform analysis result is not displayed.

In the registration process above, when the user A uploads a current waveform of the electric appliances 3A to the registration server 5 as an initial registrant, the current waveform and information on the user A, which is the initial registrant, are stored in the registration server 5. A character image corresponding to the newly registered electric appliances 3A and the information on the user A as the initial registrant are displayed on the display of the information processing apparatus 4A of the user A.

Meanwhile, when the user B uploads a current waveform of the electric appliances 3B for registration, it is determined through the registration process that registration has already been finished. The character image corresponding to the electric appliances 3B (3A) and the information on the user A, who is the initial registrant, are displayed on a display of the information processing apparatus 4B of the user B. A message such as "This electric appliance has already been registered by the user A" may be displayed in case of necessity.

Thus, in the information processing apparatus 4 of each house 1 having the electric appliances 3, the name of the user A, who is the initial registrant, or the character named by the user A is displayed. Since the initial registrant can be the owner of the unique character throughout the world, motivation for the registration operation of the current waveform of the electric appliances 3 is increased, and the initial registrant voluntarily performs the registration operation. In other words, it is possible to reduce the load of the current waveform registration operation.

[Flow of ONOFF Estimation Process]

Figure 6:
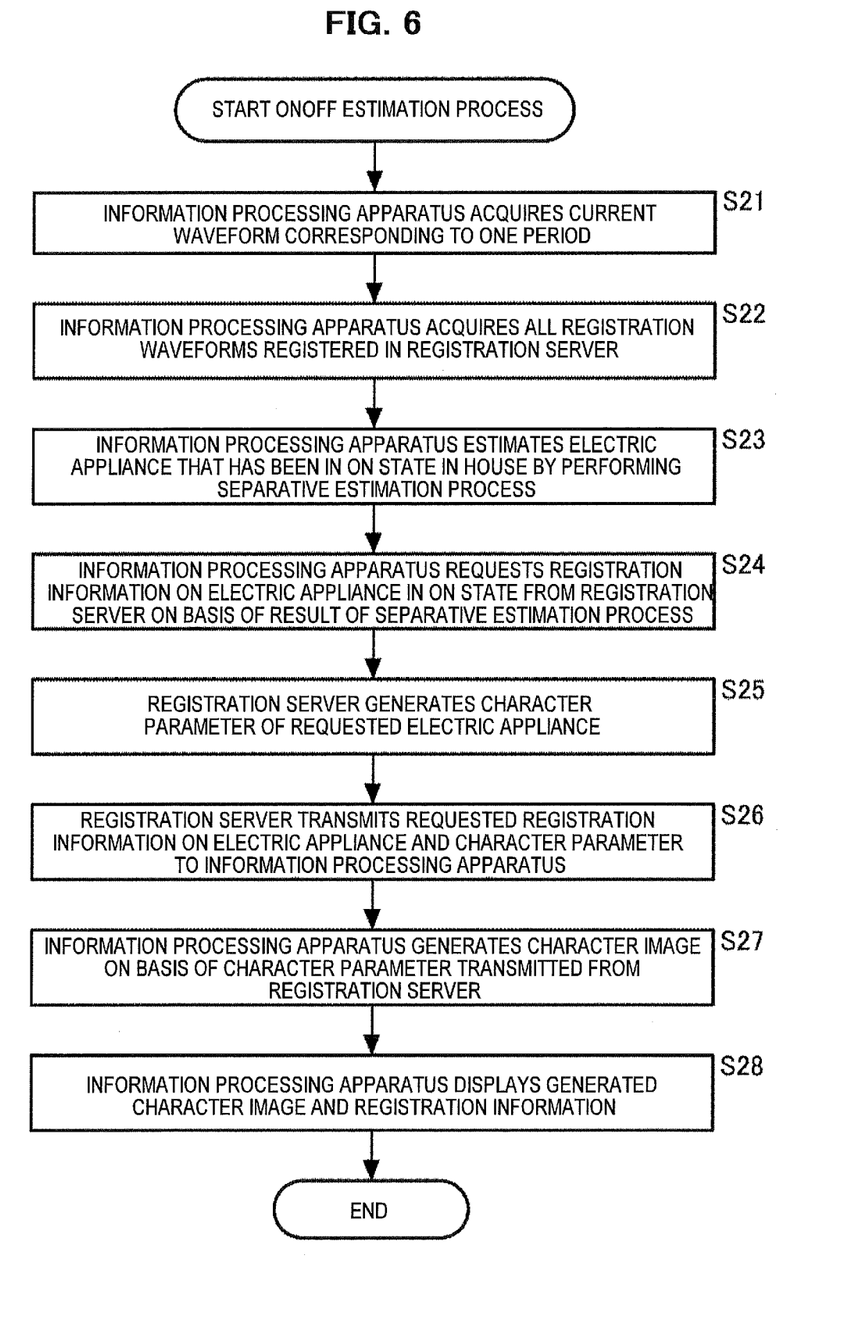
FIG. 6 is a flowchart illustrating an ONOFF estimation process.

Next, with reference to the flowchart of FIG. 6, a registration process of estimating ON/OFF states of the plurality of electric appliances 3B in the house 1B performed by the information processing apparatus 4B set in the monitoring mode will be described.

First, in step S21, the information processing apparatus 4B acquires a current waveform that corresponds to one period and is measured by the clamp ammeter 2B clamped around one point of a switchboard, which is a basis of power supply of the house 1B.

In step S22, the information processing apparatus 4B accesses the registration server 5 and acquires all registration waveforms registered in the registration server 5. Here, the process of step S22 may be performed in advance separately from the process of FIG. 6.

In step S23, the information processing apparatus 4B performs a separative estimation process, thereby estimating an electric appliance 3 that is entering the ON state in the house 1B.

In this embodiment, any method may be employed for a separative estimation process of estimating the electric appliance 3 that is entering the ON state in the house 1B. For example, a method of solving an integer quadratic programming problem of Expression (1) below stated in the non-patent document ("Nonintrusive Appliance Load Monitoring System—Discrete Operating Conditions and Integer Programming—," 42nd Society of Instrument and Control Engineers (SICE) Discrete Event System Research Group, pp. 33-38, Dec. 20, 2008, Osaka University) mentioned above can be employed for the separative estimation process.

$$\text{minimize } E = \sum_{t=0}^{T-1} \left( i(t) - \sum_{j=1}^{N} \sum_{k=1}^{M_1} c_j(k) i_j(k, t) \right)^2 \quad (1)$$

$$\text{subject to } 0 \le c_j(1), \ldots, c_j(M_j) \in Z, \quad (2)$$

$$\sum_{k=1}^{M_1} c_j(k) \le C_j \text{ for } j = 1, 2, \ldots, N \quad (3)$$

In this integer quadratic programming problem, $c_j(k)$ that minimizes an objective function E of Expression (1) is calculated under the constraints of Expression (2) and Expression (3).

In Expression (1), as the plurality of electric appliances 3 in the house 1B, electric appliances $L_1, L_2, \ldots,$ and $L_N$ having $M_1, M_2, \ldots,$ and $M_N$ operation modes (ON state) other than the OFF state so as to cope with operation in a plurality of operation modes, such as powerful and gentle, are defined to be able to operate up to $C_1, C_2, \ldots,$ and $C_N$ in number, respectively. However, since independent appliances $L_j(1), L_j(2), \ldots$ and $L_j(M_j)$ are not actually present, a plurality of appliances cannot be simultaneously put in the ON state.

In Expression (1), i(t) (t=0, ..., and t-1) denotes a current value at a time t among T sampling points constituting the current waveform corresponding to one period measured by the clamp ammeter 2B. Also, $c_j(k)$ denotes an unknown variable indicating a state (ON state) of the electric appliance $L_j$ in an operation mode $k \in \{1, \ldots, M_j\}$, and $i_j(k, t)$ denotes a registration waveform acquired from the registration server 5, indicating a current value at the time t when the electric appliance $L_j$ in the operation mode $k \in \{1, \ldots, M_j\}$.

In step S24, the information processing apparatus 4B requests registration information on the electric appliance 3 estimated to be in the ON state on the basis of the result of the separative estimation process from the registration server 5.

In step S25, the registration sever 5 generates a character parameter of the electric appliance 3 whose registration information is requested, and in step S26, transmits the requested registration information on the electric appliance 3 and the generated character parameter to the information processing apparatus 4B. The process of steps S25 and S26 is the same as the process of step S9 described above.

In step S27, the information processing apparatus 4B receives the registration information and the character parameter transmitted from the registration server 5, and generates a character image on the basis of the character parameter.

In step S28, the information processing apparatus 4B displays the generated character image and the received registration information on the display. In other words, the name of the user A, who is the initial registrant, a product name and a model number of the electric appliance 3A (3B), an image of the electric appliance 3A and the like are displayed with the generated character image, as in step S11 of FIG. 3.

In this way, through the ONOFF estimation process, an electric appliance 3 in the ON state is estimated, and the product name of the electric appliance 3 estimated to be in the ON state or information on an initial registrant of the electric appliance 3 is displayed. Also, a character image corresponding to the electric appliance 3 estimated to be in the ON state is displayed.

In the example described above, the information processing apparatus 4B receives a character parameter generated by the registration server 5 and displays a character image. However, a transform coefficient matrix W corresponding to each of the electric appliances 3B may be acquired from the registration server 5, and the information processing apparatus 4B may generate a character parameter and display a character image.

[Flow of Registration Information Update Process]

Figure 7:
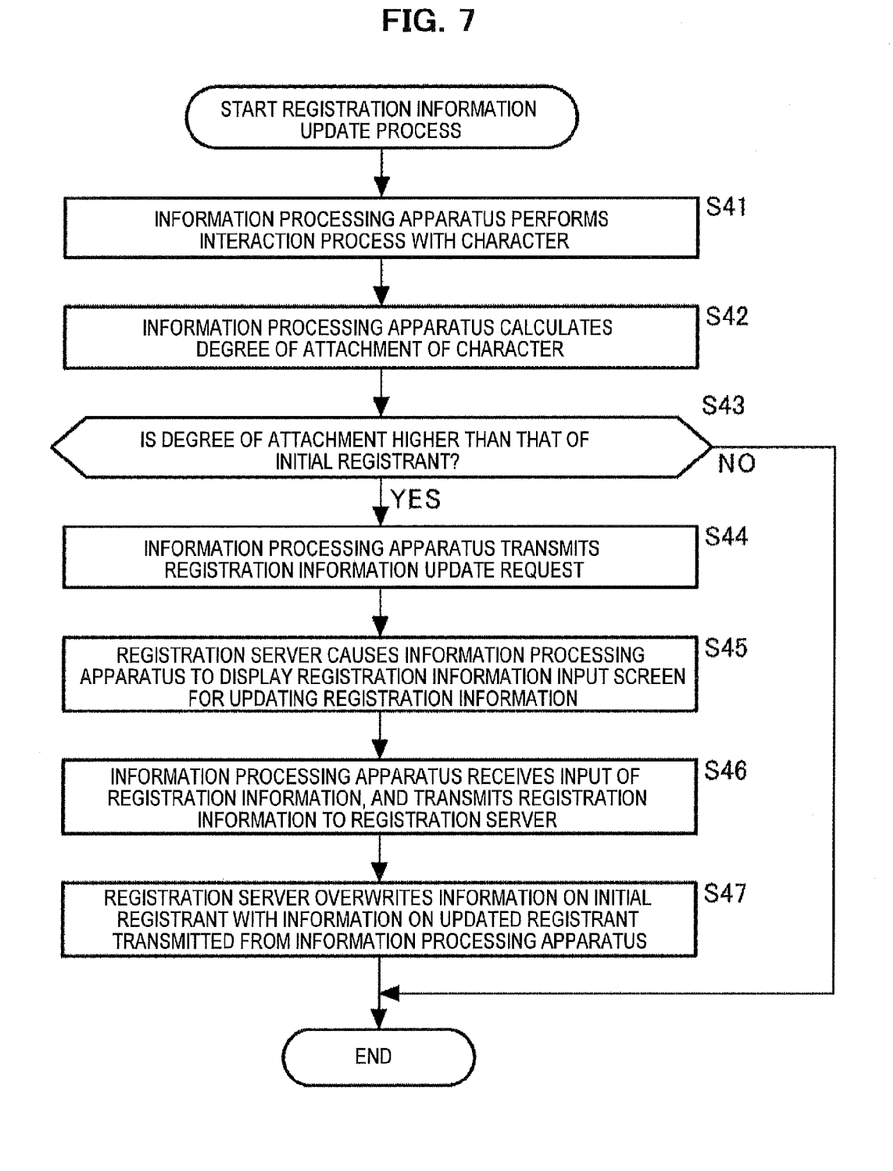
FIG. 7 is a flowchart illustrating a registration information update process.

Next, with reference to the flowchart of FIG. 7, a registration information update process that can update information on an initial registrant (user A) with information on another user (user B) will be described.

As an update condition for updating information on an initial registrant with information on another user, a variety of conditions may be set, but in this embodiment, the degree of attachment of a character is used. More specifically, when the user B begins an interaction, such as conversation (chatting) or a game, with a character displayed on the information processing apparatus 4B, the degree of attachment of the character, which is an indicator of the update condition, is updated. When the degree of attachment of the character maintained by the user B is higher than the degree of attachment of the character maintained by an initial registrant, information on the initial registrant included in registration information can be updated with information on the user B.

At first, in step S41, the information processing apparatus 4B performs an interaction process with a character on the basis of manipulation of the user B. The interaction process with the character can be, for example, a conversation with the character, a game of fighting with the character, and the like.

In step S42, the information processing apparatus 4B calculates (updates) the degree of attachment of the character on the basis of the result of the interaction process. The degree of attachment of the character can be increased in points as a conversation time with the character lengthens or can be added when the user B wins a game.

In step S43, the information processing apparatus 4B determines whether the degree of attachment of the character maintained by the user B is higher than the degree of attachment of the character maintained by an initial registrant.

When it is determined in step S43 that the degree of attachment of the character maintained by the user B is equal to or lower than the degree of attachment of the character maintained by the initial registrant, the registration information update process is finished.

On the other hand, when it is determined in step S43 that the degree of attachment of the character maintained by the user B is higher than the degree of attachment of the character maintained by the initial registrant, the process proceeds to step S44, and the information processing apparatus 4B transmits a registration information update request to the registration server 5.

In step S45, the registration server 5 receives the registration information update request from the information processing apparatus 4B and causes the information processing apparatus 4B to display a registration information input screen for updating registration information.

In step S46, the information processing apparatus 4B displays the registration information input screen on the display, receives an input of registration information made by the user B, and transmits the input registration information to the registration server 5. Unlike the process of steps S6 and S7 described above, in the registration information input screen displayed on the display of the information processing apparatus 4B, only information (items) relating to a registrant such as a user name can be input, and information other than the registrant information, for example, a product name, a model number and the like of an electric appliance 3, cannot be input. Needless to say, all items may be allowed to be input.

In step S47, the registration server 5 overwrites the information on the initial registrant with the information on the updated registrant (user B) transmitted from the information processing apparatus 4B, and finishes the process.

In the example described above, the degree of attachment (affinity) to the character calculated by beginning an interaction with the character is determined as an indicator for updating information on an initial registrant, but a value other than the degree of attachment of the character may be determined as the indicator for updating information on an initial registrant.

For example, the amount of power saving obtained by comparing current consumption of the electric appliance 3 during the last month with current consumption during the month before the last month, a time in which an operation mode of low current consumption is set, or the like can be calculated as the information update indicator, and registration information can be updated when a user is taking a power saving action more than an initial registrant. When such an update condition is used, it is possible to prompt a user for a power saving action.

Alternatively, a history of use of the electric appliance 3 can be determined as the information update indicator, and registration information can be updated when a user has more use time than an initial registrant.

Also, a registration ratio of current waveforms of the electric appliances 3 in the house 1B may be determined as the information update indicator, and registration information can be updated when a user has a higher registration ratio than an initial registrant. When such an update condition is used, it is possible to give a user motivation for a registration operation and to prompt the user for the registration operation.

[Functional Block Diagram of Information Processing Apparatus 4 and Registration Server 5]

Figure 8:
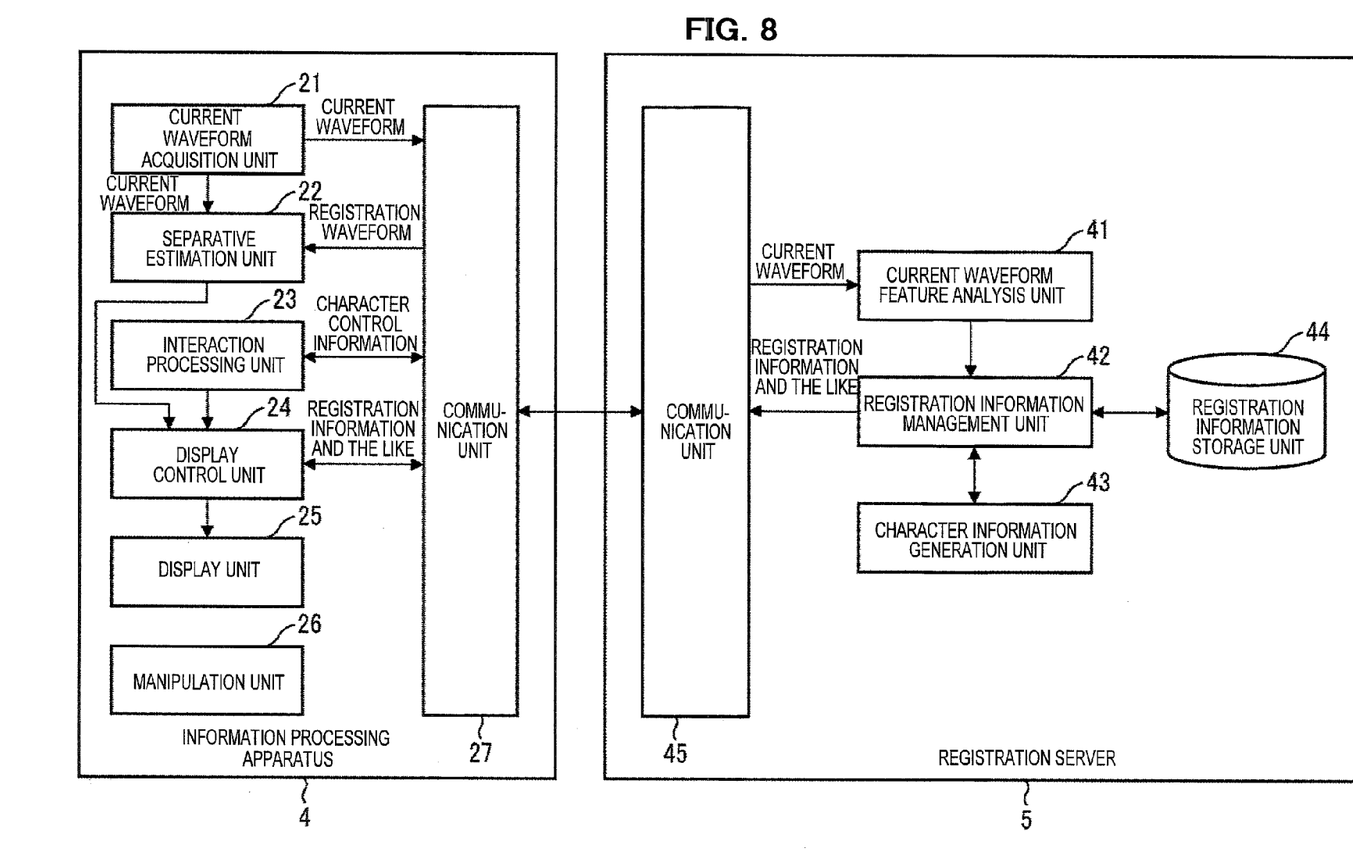
FIG. 8 is a functional block diagram of an information processing apparatus and a registration server.

FIG. 8 shows a functional block diagram of the information processing apparatus 4 and the registration server 5 that implement a process as described above.

The information processing apparatus 4 includes a current waveform acquisition unit 21, a separative estimation unit 22, an interaction processing unit 23, a display control unit 24, a display unit 25, a manipulation unit 26 and a communication unit 27.

The current waveform acquisition unit 21 acquires current waveforms of electric appliances 3 measured by the clamp ammeter 2 in units of one period. The acquired current waveforms are transmitted to the registration server 5 through the communication unit 27 in the registration mode, and supplied to the separative estimation unit 22 in the monitoring mode.

In the monitoring mode, the separative estimation unit 22 performs a separative estimation process of estimating an electric appliance 3 that is entering the ON state using the current waveforms supplied from the current waveform acquisition unit 21 and the registration waveforms of the respective electric appliances 3 supplied from the registration server 5.

The interaction processing unit 23 acquires character control information for controlling a character from the registration server 5 through the communication unit 27, and performs an interaction with the character. Also, the interaction processing unit 23 functions as an update condition determination unit, which determines whether or not an update condition for updating information on an initial registrant is satisfied on the basis of the interaction processing. Specifically, the interaction processing unit 23 calculates the degree of attachment of the character, which is an indicator of information update, and determines whether or not the calculated degree of attachment is higher than the degree of attachment of the initial registrant acquired from the registration server 5. When the calculated degree of attachment is higher than the degree of attachment of the initial registrant, the interaction processing unit 23 requests update of the information on the initial registrant from the registration server 5.

The display control unit 24 performs control of a screen (image) displayed on the display unit 25. For example, the display control unit 24 controls display of ON/OFF states of the respective electric appliances 3 on the basis of the result of the separative estimation processing by the separative estimation unit 22, or display of names, model numbers, initial registrant information and the like of the respective electric appliances 3 on the basis of registration information from the registration server 5. Also, the display control unit 24 performs display control of the character based on a character parameter.

The display unit 25 displays ON/OFF states, the names, the model numbers, the initial registrant information, characters (images) of the respective electric appliances 3 on the basis of control of the display control unit 24.

The manipulation unit 26 receives an input of predetermined information made by manipulation of a user, and appropriately supplies the received information to the respective units such as the interaction processing unit 23, the display control unit 24 and the communication unit 27.

The communication unit 27 controls transmission and reception of the predetermined information with the registration server 5.

The registration server 5 includes a current waveform feature analysis unit 41, a registration information management unit 42, a character information generation unit 43, a registration information storage unit 44, and a communication unit 45.

The current waveform feature analysis unit 41 analyzes a feature of a current waveform transmitted from the information processing apparatus 4. For example, the current waveform feature analysis unit 41 obtains the peak value P1 and the peak position T1 of the positive side and the peak value P2 and the peak position T2 of the negative side in the current waveform as shown in FIG. 4 as feature quantities of the current waveform.

The registration information management unit 42 manages registration information on the respective electric appliances 3 stored in the registration information storage unit 44. For example, the registration information management unit 42 searches whether a current waveform of a predetermined electric appliance 3 transmitted from the information processing apparatus 4 has already been registered in the registration information storage unit 44. Also, the registration information management unit 42 transmits screen information on a registration information input screen to the information processing apparatus 4 through the communication unit 45, and acquires information input in the registration information input screen of the information processing apparatus 4, thereby storing the acquired information in the registration information storage 44.

The character information generation unit 43 generates character parameters on the basis of the current waveforms of the electric appliances 3, and generates character control information according to the interaction processing of the information processing apparatus 4. Here, the character parameters are also included in the character control information.

The communication unit 45 controls transmission and reception of the predetermined information with the information processing apparatus 4.

In the embodiment described above, an example in which the information processing apparatus 4 is installed in the house 1 and monitors usage states (ON/OFF states) of the plurality of electric appliances 3 in the house 1 has been described, but needless to say, monitoring equipment may be an electric appliance 3 in a business establishment, a factory, a school and the like as well as the house 1.

Also, in the embodiment described above, a process of determining whether a current waveform of a predetermined electric appliance 3 has been registered in (the registration information storage unit 44 of) the registration server 5 is performed by (the registration information management unit 42 of) the registration server 5. However, in the registration mode, the information processing apparatus 4 may acquire all registration waveforms stored in the registration server 5 in advance, and search and determine whether the current waveform of the predetermined electric appliance 3 to be registered has already been registered. The search and determination processing can be performed by, for example, the current waveform acquisition unit 21 that acquires the current waveform of the electric appliance 3, which is a registration target.

The series of processes described above can be performed by hardware or software. When the series of processes is performed by software, a program constituting the software is installed in a computer. Here, the computer is a computer incorporated in dedicated hardware, a computer, for example, a general purpose personal computer, capable of performing a variety of functions by installing various programs, or the like.

Figure 9:
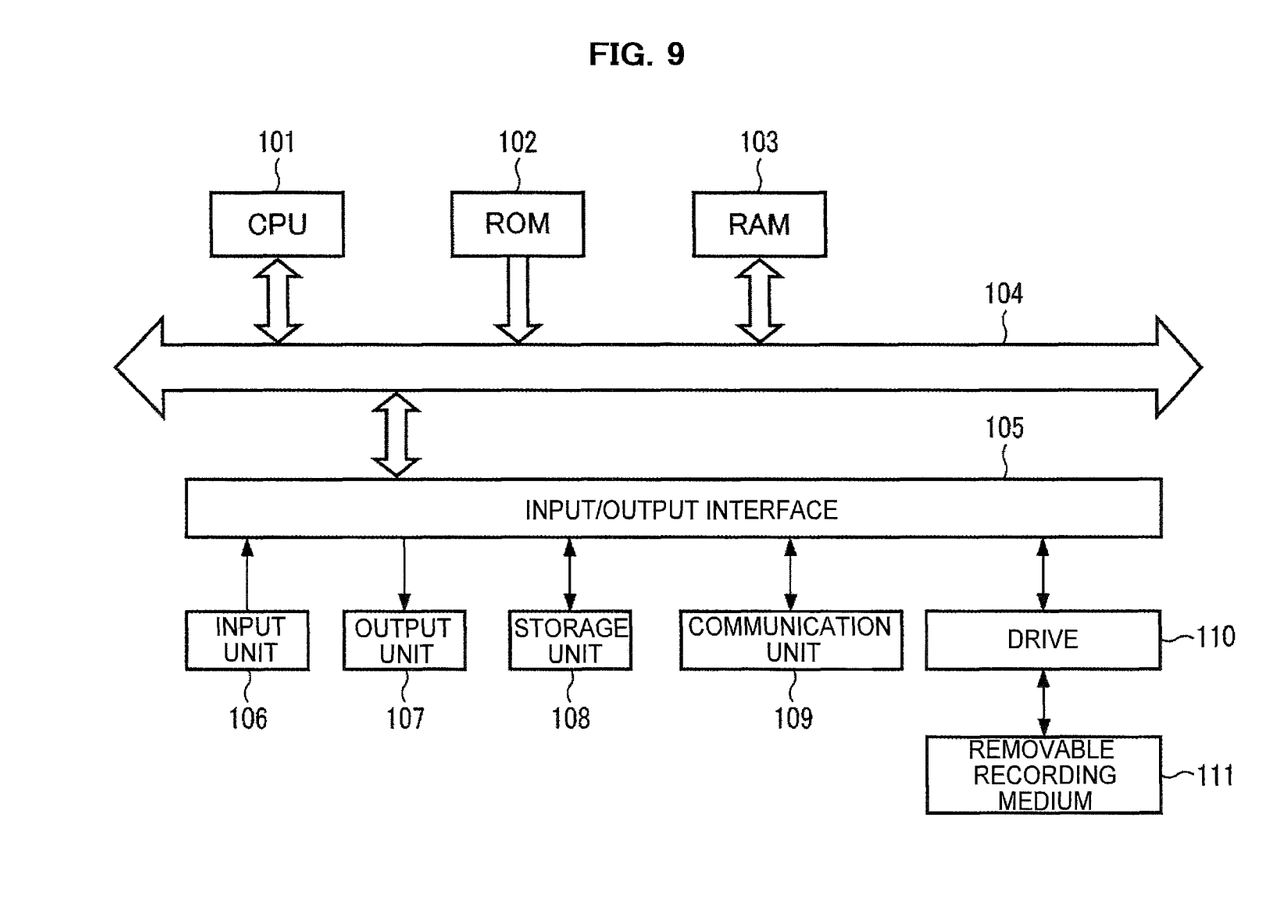
FIG. 9 is a block diagram showing a configuration example of an embodiment of a computer to which the present technology is applied.

FIG. 9 is a block diagram showing an example of a hardware configuration when the functions of the information processing apparatus 4 or the registration server 5 described above are implemented by executing a program.

In a computer, a Central Processing Unit (CPU) 101, a Read Only Memory (ROM) 102 and a Random Access Memory (RAM) 103 are connected with each other through a bus 104.

Also, an input/output interface 105 is connected to the bus 104. To the input/output interface 105, an input unit 106, an output unit 107, a storage unit 108, a communication unit 109 and a drive 110 are connected.

The input unit 106 consists of a keyboard, a mouse, a microphone and the like. The output unit 107 consists of a display, a speaker and the like. The storage unit 108 consists of a hard disk, a non-volatile memory and the like. The communication unit 109 consists of a network interface and the like. The drive 110 drives a removable recording medium 111, such as a magnetic disk, an optical disc, a magneto-optical disc or a semiconductor memory.

In the computer constituted as described above, the CPU 101 loads, for example, a program stored in the storage unit 108 into the RAM 103 through the input/output interface 105 and the bus 104, and executes the program, thereby performing the series of processes described above.

In the computer, the program can be installed in the storage unit 108 through the input/output interface 105 by inserting the removable recording medium 111 in the drive 110. Also, the program can be received by the communication unit 109 through a wired or wireless transmission medium referred to as a local area network, the Internet or digital satellite broadcasting, and installed in the storage unit 108. The program can be installed in the ROM 102 or the storage unit 108 in advance.

The program executed by the computer may be a program that performs a process in time series according to a sequence described in this specification, or a program that performs a process at a required timing such as when calling is performed.

In this specification, a system denotes a whole apparatus consisting of a plurality of apparatuses.

Embodiments of the present technology are not limited to the embodiment described above, and can be modified in various ways without departing from the spirit of the present technology.

The present technology can have a configuration as follows.

(1)

An information processing apparatus including:

a current waveform acquisition unit that acquires a current waveform from when a predetermined electric appliance is used;

a communication unit that transmits the acquired current waveform of the electric appliance to a server apparatus, and receives control information on a character corresponding to the electric appliance from the server apparatus; and a display control unit that performs control of causing a predetermined display unit to display the character based on the received control information on the character.

(2)

The information processing apparatus stated in (1) above, wherein the control information on the character is determined according to a feature of the current waveform of the electric appliance.

(3)

The information processing apparatus stated in (1) or (2) above, wherein, when the transmitted current waveform of the electric appliance is an unregistered waveform in the server apparatus, the communication unit receives screen control information that is further transmitted from the server apparatus and causes an input screen for inputting information on a user as an initial registrant to be displayed, wherein the display control unit causes the input screen to be displayed on the display unit based on the screen control information, and wherein the communication unit transmits the information on the user input in the input screen to the server apparatus.

(4)

The information processing apparatus stated in any one of (1) to (3) above, wherein, when the transmitted current waveform of the electric appliance is a waveform having been registered in the server apparatus, the communication unit receives initial registrant display control information that is further transmitted from the server apparatus and for displaying the information on the user who is the initial registrant, and wherein the display control unit causes the display unit to display the information on the user who is the initial registrant based on the initial registrant display control information.

(5)

The information processing apparatus stated in any one of (1) to (4) above, further including:

an update condition determination unit that determines whether or not an update condition for updating the information on the user as the initial registrant is satisfied, and transmits a request for updating the information on the user to the server apparatus through the communication unit when the update condition is satisfied.

(6)

The information processing apparatus stated in any one of (1) to (5) above, wherein the current waveform acquisition unit makes a determination of whether the acquired current waveform is an unregistered waveform in the server apparatus.

(7) The information processing apparatus stated in any one of (1) to (6) above, further including:

the predetermined display unit that displays the character.

(8)

An information processing method including:

acquiring a current waveform from when a predetermined electric appliance is used;

transmitting the acquired current waveform of the electric appliance to a server apparatus, and receiving control information on a character corresponding to the electric appliance from the server apparatus; and performing control of displaying a predetermined display unit to display the character based on the received control information on the character.

(9)

A program for causing a computer to perform processes of:

acquiring a current waveform from when a predetermined electric appliance is used;

transmitting the acquired current waveform of the electric appliance to a server apparatus, and receiving control information on a character corresponding to the electric appliance from the server apparatus; and performing control of causing a predetermined display unit to display the character based on the received control information on the character.

(10)

A server apparatus including:

a communication unit that receives a current waveform from when a predetermined electric appliance is used from a predetermined information processing apparatus, and transmits control information on a character corresponding to the electric appliance to the information processing apparatus;

a current waveform feature analysis unit that analyzes a feature of the received current waveform of the electric appliance; and a character information generation unit that generates the control information on the character transmitted to the information processing apparatus based on the feature of the current waveform of the electric appliance, which is the analysis result.

(11)

The server apparatus stated in (10) above, further including:

a registration information storage unit that stores the current waveform of the predetermined electric appliance; and a registration information management unit that causes the information processing apparatus to transmit screen control information causing an input screen for inputting information on a user as an initial registrant to be displayed when the electric appliance corresponding to the received current waveform has not yet been registered in the registration information storage unit, wherein the registration information management unit stores the information on the user as the initial registrant further transmitted from the information processing apparatus and the received current waveform in the registration information storage unit.

(12)

The server apparatus stated in (11) above, wherein, when the electric appliance corresponding to the received current waveform has been registered, the registration information management unit transmits initial registrant display control information for displaying the information on the user who is the initial registrant to the information processing apparatus.

(13)

The server apparatus stated in (11) or (12) above, wherein the registration information management unit transmits the screen control information to the information processing apparatus even when a user information update request for updating the information on the user who is the initial registrant is received from the information processing apparatus.

(14)

A server apparatus control method including:

receiving a current waveform from when a predetermined electric appliance is used from a predetermined information processing apparatus;

analyzing a feature of the received current waveform of the electric appliance;

generating control information on a character corresponding to the electric appliance based on the feature of the current waveform of the electric appliance, which is the analysis result; and transmitting the generated control information on the character to the information processing apparatus.

(15)

A program for causing a computer to perform processes of:

receiving a current waveform from when a predetermined electric appliance is used from a predetermined information processing apparatus;

analyzing a feature of the received current waveform of the electric appliance;

generating control information on a character corresponding to the electric appliance based on the feature of the current waveform of the electric appliance, which is the analysis result; and transmitting the generated control information on the character to the information processing apparatus.

The present disclosure contains subject matter related to that disclosed in Japanese Priority Patent Application JP 2011-130006 filed in the Japan Patent Office on Jun. 10, 2011, the entire content of which is hereby incorporated by reference.

What is claimed is:

1. An information processing apparatus, comprising:
a current waveform acquisition unit which acquires a current waveform from when a predetermined electric appliance is used;
a communication unit which transmits the acquired current waveform of the electric appliance to a server apparatus, and receives control information on a character corresponding to the electric appliance from the server apparatus; and
a display control unit which performs control of causing a predetermined display unit to display the character based on the received control information on the character.

2. The information processing apparatus according to claim 1,
wherein the control information on the character is determined according to a feature of the current waveform of the electric appliance.

3. The information processing apparatus according to claim 1,
wherein, when the transmitted current waveform of the electric appliance is an unregistered waveform in the server apparatus, the communication unit receives screen control information that is further transmitted from the server apparatus and causes an input screen for inputting information on a user as an initial registrant to be displayed,
wherein the display control unit causes the input screen to be displayed on the display unit based on the screen control information, and
wherein the communication unit transmits the information on the user input in the input screen to the server apparatus.

4. The information processing apparatus according to claim 1,
wherein, when the transmitted current waveform of the electric appliance is a waveform having been registered in the server apparatus, the communication unit receives initial registrant display control information that is further transmitted from the server apparatus and for displaying information on a user who is an initial registrant, and
wherein the display control unit causes the display unit to display the information on the user who is the initial registrant based on the initial registrant display control information.

5. The information processing apparatus according to claim 1, further comprising
an update condition determination unit which determines whether or not an update condition for updating information on a user as an initial registrant is satisfied, and transmits a request for updating the information on the user to the server apparatus through the communication unit when the update condition is satisfied.

6. The information processing apparatus according to claim 1,
wherein the current waveform acquisition unit makes a determination of whether the acquired current waveform is an unregistered waveform in the server apparatus.

7. The information processing apparatus according to claim 1, further comprising
the predetermined display unit which displays the character.

8. An information processing method, comprising:
acquiring a current waveform from when a predetermined electric appliance is used;
transmitting the acquired current waveform of the electric appliance to a server apparatus, and receiving control information on a character corresponding to the electric appliance from the server apparatus; and
performing control of causing a predetermined display unit to display the character based on the received control information on the character.

9. A program for causing a computer to perform:
acquiring a current waveform from when a predetermined electric appliance is used;
transmitting the acquired current waveform of the electric appliance to a server apparatus, and receiving control information on a character corresponding to the electric appliance from the server apparatus; and performing control of causing a predetermined display unit to display the character based on the received control information on the character.

10. A server apparatus, comprising:
a communication unit which receives a current waveform from when a predetermined electric appliance is used from a predetermined information processing apparatus, and transmits control information on a character corresponding to the electric appliance to the information processing apparatus;
a current waveform feature analysis unit which analyzes a feature of the received current waveform of the electric appliance; and
a character information generation unit which generates the control information on the character transmitted to the information processing apparatus based on the feature of the current waveform of the electric appliance that is the analysis result.

11. The server apparatus according to claim 10, further comprising:
a registration information storage unit that stores the current waveform of the predetermined electric appliance; and
a registration information management unit that causes the information processing apparatus to transmit screen control information causing an input screen for inputting information on a user as an initial registrant to be displayed when the electric appliance corresponding to the received current waveform has not yet been registered in the registration information storage unit,
wherein the registration information management unit stores the information on the user as the initial registrant further transmitted from the information processing apparatus and the received current waveform in the registration information storage unit.

12. The server apparatus according to claim 11,
wherein, when the electric appliance corresponding to the received current waveform has been registered, the registration information management unit transmits initial registrant display control information for displaying information on the user who is the initial registrant to the information processing apparatus.

13. The server apparatus according to claim 11,
wherein the registration information management unit transmits the screen control information to the information processing apparatus even when a user information update request for updating the information on the user who is the initial registrant is received from the information processing apparatus.

14. A server apparatus control method, comprising:
receiving a current waveform from when a predetermined electric appliance is used from a predetermined information processing apparatus;
analyzing a feature of the received current waveform of the electric appliance;
generating control information on a character corresponding to the electric appliance based on the feature of the current waveform of the electric appliance, which is the analysis result; and
transmitting the generated control information on the character to the information processing apparatus.

15. A program for causing a computer to perform:
receiving a current waveform from when a predetermined electric appliance is used from a predetermined information processing apparatus;
analyzing a feature of the received current waveform of the electric appliance;
generating control information on a character corresponding to the electric appliance based on the feature of the current waveform of the electric appliance, which is the analysis result; and
transmitting the generated control information on the character to the information processing apparatus.

* * * * *